(12) United States Patent
Bronnimann

(10) Patent No.: US 6,509,737 B1
(45) Date of Patent: Jan. 21, 2003

(54) TILTED GRADIENT COILS

(75) Inventor: Charles E. Bronnimann, Fort Collins, CO (US)

(73) Assignee: Varian, Inc., Palo Alto, CA (US)

(*) Notice: Subject to any disclaimer, the term of this patent is extended or adjusted under 35 U.S.C. 154(b) by 0 days.

(21) Appl. No.: 09/641,294

(22) Filed: Aug. 18, 2000

(51) Int. Cl.⁷ ................................................. G01V 3/00
(52) U.S. Cl. ....................................... 324/318; 324/322
(58) Field of Search ................................ 324/318, 322, 324/307, 309

(56) References Cited

U.S. PATENT DOCUMENTS

| | | | |
|---|---|---|---|
| 5,872,452 A | 2/1999 | Cory et al. | 324/321 |
| 6,118,274 A | * 9/2000 | Roffmann et al. | 324/321 |

\* cited by examiner

Primary Examiner—Edward Lefkowitz
Assistant Examiner—Dixomara Vargas

(57) ABSTRACT

A cylindrical body such as a rotor structure containing a sample for an NMR experiment has its axial direction making a selected non-zero angle φ with a predetermined Z-axis. In order to establish a magnetic field such that its component in the Z-direction varies linearly along the axial direction of the cylindrical body, a pair of coil elements which are serially related and are in an electrically antiparallel relationship are provided on mutually parallel planes so as to overlap each other as seen perpendicularly to these parallel planes. The angle between the normal line to these parallel planes determining the orientation of the coil elements and the axial direction of the cylindrical body should be nearly equal to 2φ–90°, based on the known property of a tilted Maxwell's pair, but may be different by an experimentally determinable small angle.

9 Claims, 2 Drawing Sheets

TILTED GRADIENT COILS

BACKGROUND OF THE INVENTION

The invention is in the field of nuclear magnetic resonance (NMR) and more particularly to coils to be wound around a cylindrical sample-containing body oriented at a selected angle with respect to a predetermined direction for generating a magnetic field of which the component in this predetermined direction will vary linearly along the axial direction of the cylindrical body.

It is a standard procedure of analysis by magnetic resonance to rotate a sample at a high speed in a uniform magnetic field to obtain an improved average homogeneous sample volume. It is also characteristic of certain specific experiments to orient the rotational axis of the sample at a selected angle with respect to this uniform magnetic field. The selected angle is usually the so-called magic angle which is equal to the root of the equation $3\cos^2\phi - 1 = 0$, or about $54.7°$.

In some applications, it is desirable to generate a magnetic field of which the component in the direction of the uniform field changes linearly along a specified direction such as the axial direction of rotation of the sample-containing cylinder.

SUMMARY OF THE INVENTION

It is therefore an object of this invention to provide a device having a cylindrical body and means for establishing a magnetic field of which the component along a predetermined direction varies linearly along the axial direction of the cylindrical body.

A device embodying this invention, with which the above and other objects can be achieved, may be characterized wherein the cylindrical body with its axis of symmetry making a non-zero angle $\phi$ is surrounded by a pair of coils of the same shape which are in mutually parallel planes, overlapping each other as seen perpendicularly to these planes and wherein the normal line to these planes make an angle $\alpha$ nearly equal to $2\phi - 90°$ from the predetermined direction.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings.

DETAILED DESCRIPTION OF THE INVENTION

The invention is based on certain known properties of a tilted Maxwell's pair. A Maxwell's pair, as this expression is understood in a broader sense, is comprised of a pair of identical circular loops which are serially related in an electrically anti-parallel relationship, lying in mutually parallel planes and overlapping with respect to each other as seen perpendicularly to their mutually parallel planes.

Figure 1:
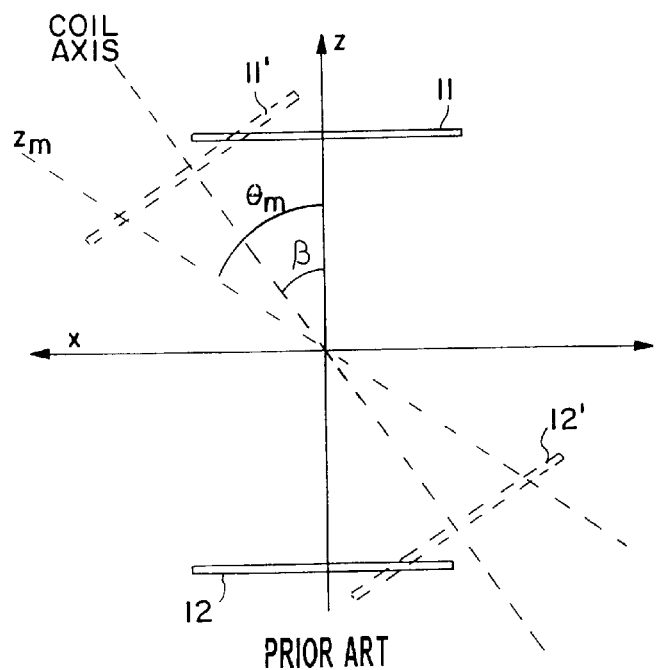
FIG. 1 is a side view of a Maxwell's pair for explaining the change in its magnetic field when it is tilted.

For the convenience of description, FIG. 1 shows two loops 11 and 12 forming a Maxwell's pair, the z-axis of a coordinate system being defined perpendicularly to the planes of the loops 11 and 12, passing through their centers. The mid-point between the centers of these two loops 11 and 12 is the origin of the coordinate system, and the mutually perpendicular x-axis and y-axis are defined as shown. An important property of a Maxwell's pair, such as shown in FIG. 1, is that it produces a magnetic field of which the z-component ($B_z(z)$) changes substantially linearly with the z-coordinate at least within the region between the two loops 11 and 12. If the same Maxwell's pair is rotated by $\beta$ around the y-axis such that its coils 11 and 12 are now at positions indicated by numerals 11' and 12', the z-component of the magnetic field ($B_z'(x,z)$) produced by such a tilted Maxwell's pair of coils 11' and 12' can be obtained as a function of x and z from certain known irreducible tensor properties of magnetic field gradients (See, for example, U.S. Pat. No. 5,872,452 issued Feb. 16, 1999 to D. G. Cory et al.; Yahong Sun and Gary Maciel, "The Tilted Coil for NMR Experiments", J. of Magnetic Resonance, Series A 105, 145–150 (1993); and G. Schauss, B. Blumich and H. W. Spiess, "Conditions for Generating Rotating Gradients in MAS NMR Imaging", ibid. 95, 437–441 (1991)). If it is required that $B_z'$ should change linearly along an axis ("$Z_m$ axis") tilted from the z-axis by the magic angle ($=54.7° = \theta_m$) within the xz-plane, one obtains that $\beta = 35.3° = 90° - \theta_m$. In other words, the angle between the coil axis (or the line normal to the planes of the coils through their centers) and the aforementioned $z_m$ axis should be $\theta_m - (90° - \theta_m) = 54.7° - 35.3° = 19.4°$, that is, the difference between the magic angle and the complement of the magic angle.

Figure 2:
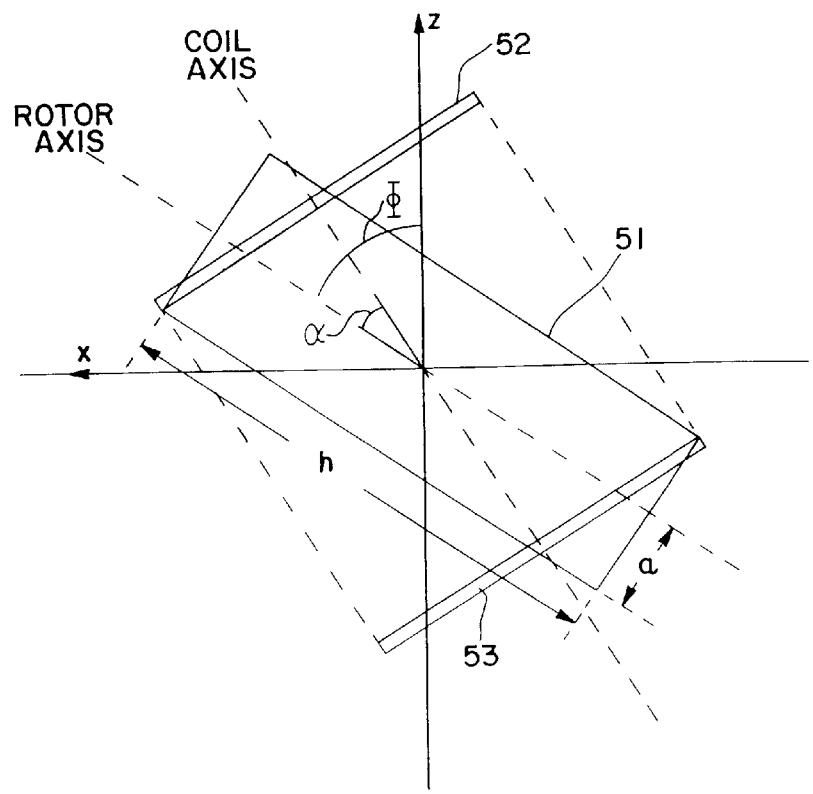
FIG. 2 is a schematic side view of main components of a device embodying this invention for showing their dimensional and positional relationships.

FIG. 2 is a schematic drawing of main parts of a device embodying this invention for establishing a magnetic field of which the component along a predetermined direction varies linearly along a selected direction making a certain non-zero angle from this predetermined direction. The device, for example, may typically be a part of an NMR spectrometer comprising a cylindrical body 51 which may be a rotor assembly containing a sample. The central axis of symmetry (hereinafter referred to as "the rotor axis") of this cylindrical body 51 is obliquely oriented, making a selected non-zero angle $\phi$ with a predetermined direction referred to as the Z-direction. In the case of an application to NMR, this predetermined direction may be the direction of a static magnetic field $B_0$ serving as the polarizing field and the selected angle is typically the magic angle $\theta_m$ defined above.

In view of the property of the tilted Maxwell's pair described above, the cylindrical body 51 is provided with a pair of coil elements (or simply "coils") 52 and 53 on mutually parallel planes and overlapping as seen along their common central axis (referred to also as "the coil axis") making an angle nearly equal to $(2\phi - 90°)$ with the rotor axis in order to establish a magnetic field of which the Z-component should vary linearly along the rotor-axis. These coil elements 52 and 53 are serially related and are in an electrically anti-parallel relationship, as are the coils of a Maxwell's pair. They may have any number of loops and need not be circular.

Let the radius of the cross-sectionally circular shape and the height of the cylindrical body 51 be represented respectively by a and h. Although the invention does not impose any strict limitation on the separation between the coil elements 52 and 53 along the coil axis, it is preferable to be at least ($h \cos\alpha - 2a \sin\alpha$) such that the cylindrical body 51 is mostly within the cylindrical volume bounded by the two coil elements 52 and 53 as shown in FIG. 2.

The coil elements 52 and 53 need not be circular. In order to reduce the overall bulk of the device, it may preferably be eliptical, with its minor axis equal to or greater than a and its major axis equal to or greater than (h sin α+2a cos α)/2.

Figure 3:
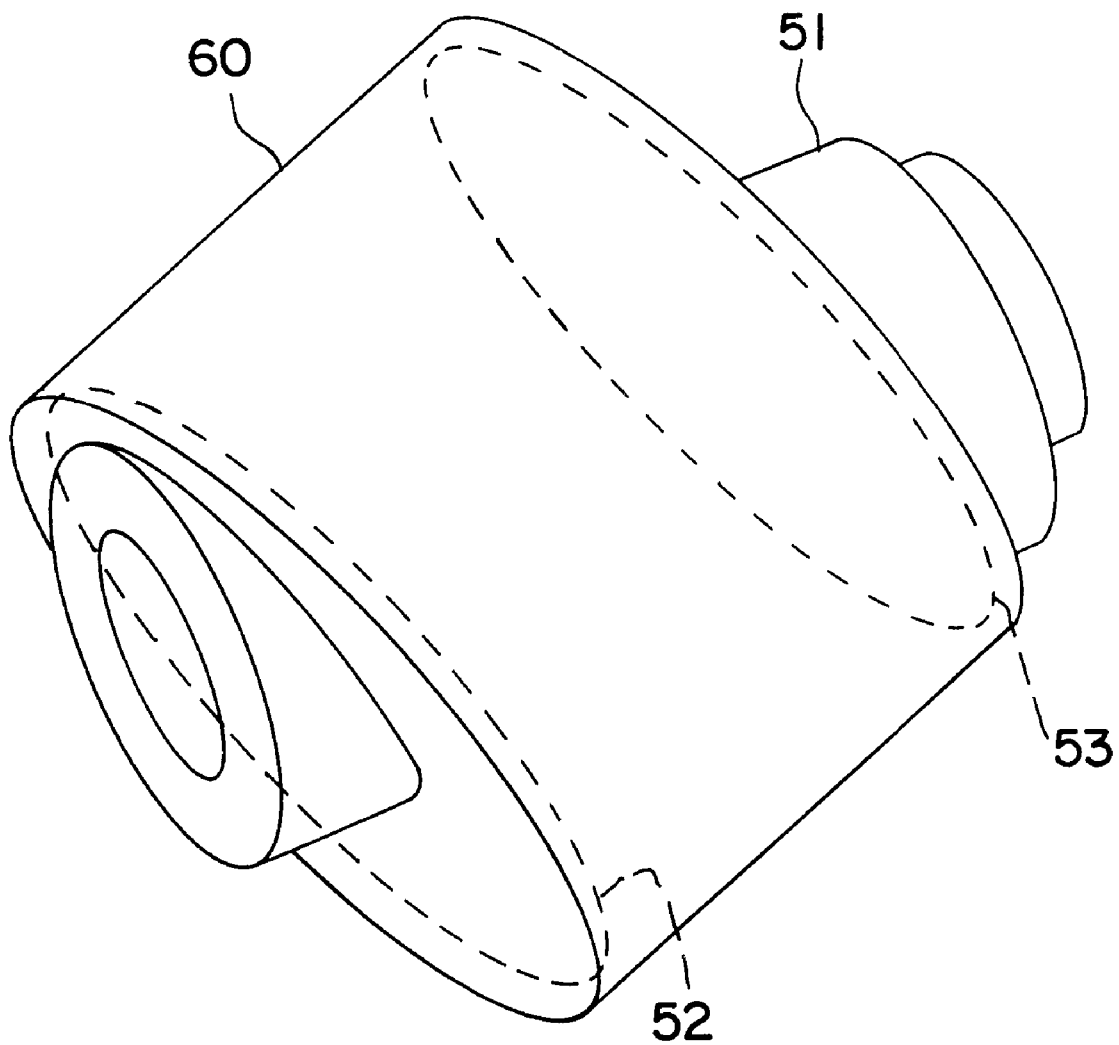
FIG. 3 is a diagonal view of a device embodying this invention.

FIG. 3 is an external view of a device embodying the invention, characterized as being generally structured as described above with reference to FIG. 2 and further comprising a housing structure 60 which may be referred to as "the former" which serves to securely support therein the cylindrical body 51 and the coil elements 52 and 53 (not visible in FIG. 3) such that they maintain their orientational and positional relationships as described above. Although a generally cylindrically shaped housing structure is disclosed because this is advantageous from the point of view of structural strength, the housing structure may be of a form with two disks each containing therein one of the coil elements 52 and 53 attached to the outer wall of the rotor assembly.

The invention has been described above by way of only one example but this example is not intended to limit the scope of the invention. Many modifications and variations are possible within the scope of this invention. For example, the selected direction need not necessarily make a magic angle with the predetermined reference direction. The coil elements 52 and 53 need not be either circular or elliptical and may be polygonal. Thus, the housing structure, if cylindrical, need not be circular or elliptical in its cross-sectional shape. It should be noted that the coil elements 52 and 53 according to the invention may not be a Maxwell's pair in the strictly narrow meaning of the expression. Thus, an optimally linear variation in the Z-component of the magnetic field along the selected direction, whether or not it is rotated from the Z-axis by a magic angle, may not necessarily be achieved by orienting the coil elements 52 and 53 exactly at an angle α as defined above, but rather at an experimentally ascertainable angle which is nearly equal to α as defined above, being different by a small angle such as 2E or less. In other words, the invention teaches the orientation of the coil elements 52 and 53 to be nearly equal to (2φ−90°) and the expression "nearly equal" is intended to be interpreted as meaning that the difference between the angle to be selected between the coil axis and the rotor axis should be determined within a range of (2φ−90°)±2°, depending on the separation between the coil elements 52 and 53, their shape and their other physical characteristics such that the variation in the Z-component of the resultant magnetic field is optimally close to being linear.

It is to be understood that while the invention has been described above in conjunction with preferred specific embodiments, the description and examples are intended to illustrate and not limit the scope of the invention, which is defined by the scope of the appended claims.

What is claimed is:

1. A device for establishing a magnetic field with a uniform gradient, said device comprising:

a cylindrical body with an axial direction making a non-zero angle φ with a predetermined direction; and a pair of continuously curved coils around said cylindrical body, said coils being serially related in an electrically anti-parallel relationship and being on mutually parallel planes which are separated from each other by a specified distance and have a normal line making an angle α nearly equal to 2φ−90° from said axial direction, said pair of coils overlapping exactly as seen perpendicularly to said planes, wherein said pair of coils establishes a magnetic field with component in said predetermined direction varying linearly along said axial direction.

2. The device of claim 1, wherein φ is such that $3 \cos^2 \phi - 1 = 0$.

3. The device of claim 1, wherein α is within a range 2φ−90°±2°.

4. The device of claim 1, wherein said cylindrical body is cross-sectionally circular with radius a and is of height h and wherein said specified distance is not less than h cos α−2a sin α.

5. The device of claim 4, wherein said coils are elliptical, having a minor axis greater than a.

6. The device of claim 5, wherein said coils have a major axis greater than (h sin α+2a cos α)/2.

7. The device of claim 1, further comprising a structure for supporting said coils with respect to said cylindrical body.

8. The device of claim 7, wherein said structure is cylindrical with axis at angle α with respect to said cylindrical body.

9. The device of claim 1 wherein said coils of elliptical shape are circular.

* * * * *